(12) United States Patent
Arai et al.

(10) Patent No.: US 6,208,076 B1
(45) Date of Patent: Mar. 27, 2001

(54) ORGANIC ELECTROLUMINESCENT DEVICE WITH SILICONE OXIDE AND/OR GERMANIUM OXIDE INSULATIVE LAYER

(75) Inventors: Michio Arai; Isamu Kobori; Etsuo Mitsuhashi, all of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/229,569

(22) Filed: Jan. 13, 1999

(30) Foreign Application Priority Data

Jan. 13, 1999 (JP) .................................................. 11-006874

(51) Int. Cl.$^7$ ............................ H01L 33/00; H05B 33/00
(52) U.S. Cl. ...................... 313/504; 313/506; 313/502; 313/503; 313/509; 257/96; 257/103
(58) Field of Search ................................... 313/498–512; 257/94, 96, 103; 428/917, 690

(56) References Cited

U.S. PATENT DOCUMENTS

| 5,409,783 | * | 4/1995 | Tang et al. ........................... 428/690 |
| 5,554,449 | * | 9/1996 | Tonomura et al. ................... 428/690 |
| 5,589,733 | * | 12/1996 | Noda et al. .......................... 313/509 |
| 5,675,217 | * | 10/1997 | Kang .................................... 313/509 |
| 5,952,779 | | 9/1999 | Arai et al. . |
| 5,969,474 | | 10/1999 | Arai . |
| 5,981,092 | | 11/1999 | Arai et al. . |
| 6,111,274 | * | 8/2000 | Arai ...................................... 257/96 |
| 6,121,727 | * | 9/2000 | Kanai et al. .......................... 313/504 |

FOREIGN PATENT DOCUMENTS

| 0 668 620 | 8/1995 | (EP) . |
| 9-63771 | 3/1997 | (JP) . |
| 9-260062 | 10/1997 | (JP) . |

OTHER PUBLICATIONS

Y. Kurosaka, et al., Technical Report of IEICE, pp. 17–22, "Study On Enhanced Luminous Efficiency In Organic El Device—Effect Of Insertion Of Buffer Layer–", Oct., 1998, (with English Abstract and Concise Explanation).

Y. Kurosaka, et al., Technical Report of IEICE, pp. 63–68, "Improvement Of Emission Characteristic Of Organic El Device", Jul., 1998, Missing pp. 64, 66, and 68, which will be filed later, (With English Abstract and Concise Explanation).

* cited by examiner

*Primary Examiner*—Ashok Patel
*Assistant Examiner*—Matthew J. Gerike
(74) *Attorney, Agent, or Firm*—Oblon, Spivak, McClelland, Maier & Neustadt, P.C.

(57) ABSTRACT

The invention provides an organic EL device comprising a hole injecting electrode, a negative electrode, at least one organic layer between the electrodes, the organic layer including a light emitting layer having a light emitting function, and a hole injecting and transporting layer containing a hole transporting organic material and an inorganic insulative hole injecting and transporting layer formed of an inorganic material between the hole injecting electrode and the light emitting layer. The inorganic insulative hole injecting and transporting layer contains silicon oxide and/or germanium oxide as a main component, the main component having an average composition represented by the formula: $(Si_{1-x}Ge_x)O_y$ wherein $0 \leq x \leq 1$ and $1 < y \leq 2$. This construction enables an organic EL device having better performance than prior art devices having hole injecting and transporting layers using organic materials, a long life, weather resistance, high stability, high efficiency, and low cost.

4 Claims, 2 Drawing Sheets

ORGANIC ELECTROLUMINESCENT DEVICE WITH SILICONE OXIDE AND/OR GERMANIUM OXIDE INSULATIVE LAYER

BACKGROUND OF THE INVENTION

1. Technical Field

This invention relates to an organic electroluminescent (EL) device and more particularly, to an inorganic/organic junction structure suitable for use in a device of the type wherein an electric field is applied to a thin film of an organic compound to emit light.

2. Background Art

In general, organic EL devices have a basic configuration including a glass substrate, a transparent electrode of ITO etc., a hole transporting layer of an organic amine compound, an organic light emitting layer of a material exhibiting electronic conductivity and intense light emission such as Alq3, and an electrode of a low work function metal such as MgAg, wherein the layers are stacked on the substrate in the described order.

The device configurations which have been reported thus far have one or more organic compound layers interposed between a hole injecting electrode and an electron injecting electrode. The organic compound layers are typically of two- or three-layer structure.

Included in the two-layer structure are a structure having a hole transporting layer and a light emitting layer formed between the hole injecting electrode and the electron injecting electrode and another structure having a light emitting layer and an electron transporting electrode formed between the hole injecting electrode and the electron injecting electrode. Included in the three-layer structure is a structure having a hole transporting layer, a light emitting layer, and an electron transporting layer formed between the hole injecting electrode and the electron injecting electrode. Also known is a one-layer structure wherein a single layer playing all the roles is formed from a polymer or a mixed system.

FIGS. 3 and 4 illustrate typical configurations of organic EL devices.

In FIG. 3, a hole transporting layer 14 and a light emitting layer 15 of organic compounds are formed between a hole injecting electrode 12 and an electron injecting electrode 13 on a substrate 11. In this configuration, the light emitting layer 15 also serves as an electron transporting layer.

In FIG. 4, a hole transporting layer 14, a light emitting layer 15, and an electron transporting layer 16 of organic compounds are formed between a hole injecting electrode 12 and an electron injecting electrode 13 on a substrate 11.

Attempts have been made to improve the luminous efficiency of these organic EL devices. With the prior art device configuration, however, for reasons of poor electron blocking of the hole injecting and transporting layer, it was difficult to achieve efficient recombination of electrons with holes in the light emitting layer and hence, to provide a device with a fully satisfactory efficiency.

SUMMARY OF THE INVENTION

An object of the present invention is to provide an organic EL device having better performance than prior art devices having hole injecting and transporting layers using organic materials, a long life, weather resistance, high stability, high efficiency, and low cost.

This and other objects are achieved by the present invention which is defined below.

(1) An organic electroluminescent device comprising a hole injecting electrode, a negative electrode, and at least two organic layers between the electrodes, said organic layers including a light emitting layer having a light emitting function, said device further comprising a hole injecting and transporting layer containing a hole transporting organic material and an inorganic insulative hole injecting and transporting layer formed of an inorganic material between said hole injecting electrode and said light emitting layer, said inorganic insulative hole injecting and transporting layer comprising silicon oxide or germanium oxide or a mixture of silicon oxide and germanium oxide as a main component, the main component having an average composition represented by the formula: $(Si_{1-x}Ge_x)O_y$ wherein $0 \leq x \leq 1$ and $1 < y \leq 2$.

(2) The organic electroluminescent device of (1) wherein said inorganic insulative hole injecting and transporting layer satisfies $1.4 \leq y \leq 1.99$.

(3) The organic electroluminescent device of (1) wherein said inorganic insulative hole injecting and transporting layer has a thickness of up to 5 nm.

(4) The organic electroluminescent device of (1) wherein said inorganic insulative hole injecting and transporting layer is formed between said light emitting layer and said hole injecting and transporting layer containing a hole transporting organic material.

DESCRIPTION OF PREFERRED EMBODIMENTS

Figure 1:
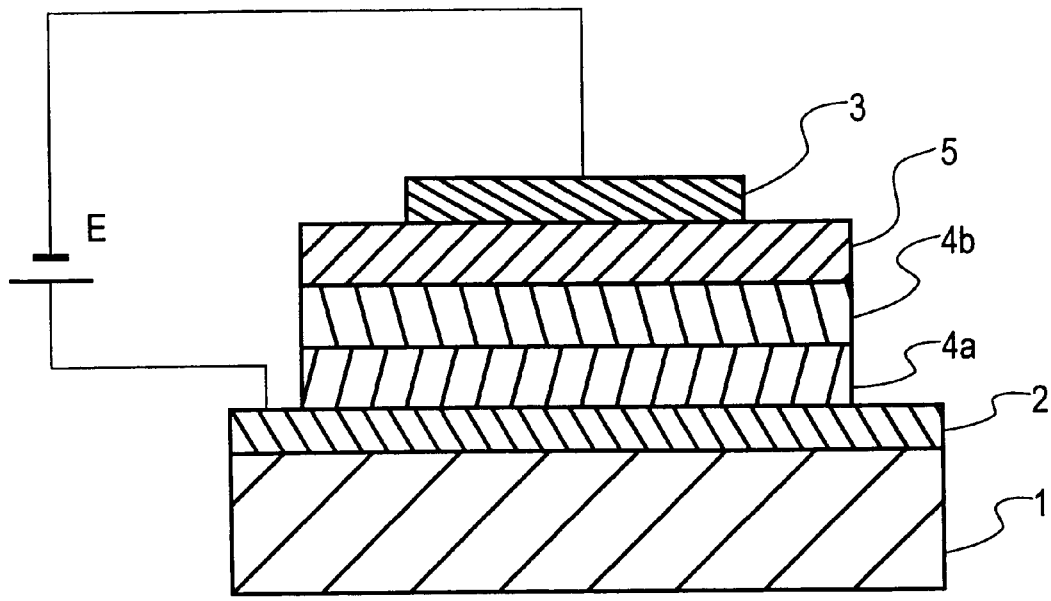
FIG. 1 is a schematic cross-sectional view illustrating the configuration of an organic EL device according to one embodiment of the invention.

The organic EL device of the invention has a hole injecting electrode, a negative electrode, and at least one organic layer between the electrodes, the organic layer including a light emitting layer having a light emitting function. The device further has a hole injecting and transporting layer containing a hole transporting organic material and an inorganic insulative hole injecting and transporting layer formed of an inorganic material between the hole injecting electrode and the light emitting layer. The inorganic insulative hole injecting and transporting layer consists essentially of silicon oxide or germanium oxide or a mixture of silicon oxide and germanium oxide as a main component, the main component having an average composition represented by the formula: $(Si_{1-x}Ge_x)O_y$ wherein $0 \leq x \leq 1$ and $1 < y \leq 2$.

By forming the hole injecting and transporting layer as a two-layer structure of organic and inorganic layers, the blocking of electrons can be outstandingly improved. The oxide as the main component of the inorganic insulative hole injecting and transporting layer is oxygen poor so that oxygen vacancies are created therein, allowing effective injection of holes from the hole injecting electrode to the organic layer on the light emitting layer side. Additionally, the migration of electrons from the organic layer (organic layer) to the hole injecting electrode is restrained, ensuring effective recombination of holes and electrons in the light emitting layer. The organic EL device of the invention is effectively applicable to displays of the time-division drive mode which are required to produce a high luminance of light emission and has both the advantages of inorganic material and the advantages of organic material. The organic EL device of the invention produces a luminance equal to or greater than that of prior art devices having an organic hole injecting layer. Owing to high heat resistance and weather resistance, the organic EL device of the invention has a longer service life than the prior art devices and develops minimal leaks and dark spots. Since not only a relatively expensive organic material, but also an inexpensive, readily available inorganic material are used, the cost of manufacture can be reduced.

It suffices that y representative of the oxygen content falls within the above-defined composition range, that is, y is in excess of 1 and up to 2. If y is outside this range, the layer has a reduced hole injecting capability, leading to a drop of luminance. Preferably y is from 1.4 to 1.99, more preferably from 1.7 to 1.99, and especially from 1.7 to 1.96.

The inorganic insulative hole injecting and transporting layer may be a thin film of silicon oxide or germanium oxide or a mixture of silicon oxide and germanium oxide. Symbol x representative of the germanium to silicon ratio is $0 \leq x \leq 1$. Preferably x is up to 0.4, more preferably up to 0.3, and especially up to 0.2.

Alternatively, x is preferably at least 0.6, more preferably at least 0.7, and especially at least 0.8.

The content of oxygen represents an average composition within the film and is determined by x-ray diffractometry (XRD), Rutherford back-scattering or another analysis.

The inorganic insulative hole injecting and transporting layer may further contain as impurities neon, argon, krypton, xenon and other elements which are used as the sputtering gas, preferably in a total amount of up to 10 at%, more preferably about 0.01 to 2% by weight, and especially about 0.05 to 1.5% by weight. These elements may be contained alone or in admixture of two or more. The mixture of two or more elements may have an arbitrary mix ratio.

These elements are used as the sputtering gas and thus introduced into the inorganic insulative hole injecting and transporting layer during its formation. If the content of these elements is too high, the trapping capability becomes extremely low and the desired performance is lost.

The content of the sputtering gas is determined by the pressure, the flow rate ratio of sputtering gas to oxygen, deposition rate, and other factors during film formation, especially the pressure during film formation. In order that the content of the sputtering gas fall within the above-described range, it is preferred to effect film deposition in higher vacuum, specifically in a vacuum of 1 Pa or lower, especially 0.1 to 1 Pa.

As long as the overall inorganic insulative hole injecting and transporting layer has the above-described composition on the average, the layer need not be uniform in composition and may be of a structure having a graded concentration in a thickness direction. In such a case, it is preferred that oxygen be poor on the interface side with the organic layer (light emitting layer).

The inorganic insulative hole injecting and transporting layer is normally amorphous.

The thickness of the inorganic insulative hole injecting and transporting layer is up to about 5 nm, preferably about 0.3 nm to about 3 nm. Electron blockage and hole injection efficiency would become insufficient when the thickness of the inorganic insulative hole injecting and transporting layer is outside the range.

Methods for preparing the inorganic insulative hole injecting and transporting layer include various physical and chemical thin film forming methods such as sputtering and electron beam (EB) vapor deposition, with the sputtering being preferred.

When the inorganic insulative hole injecting and transporting layer is formed by sputtering, the sputtering gas is preferably under a pressure of 0.1 to 1 Pa during sputtering. The sputtering gas may be any of inert gases used in conventional sputtering equipment, for example, Ar, Ne, Xe, and Kr. Nitrogen ($N_2$) gas may be used if necessary. Reactive sputtering may be carried out in an atmosphere of the sputtering gas mixed with about 1 to about 99% of oxygen ($O_2$) gas. The target used herein is the above-described oxide or oxides, and either single source or multiple source sputtering may be carried out.

The sputtering process may be an RF sputtering process using an RF power source or a DC reactive sputtering process, with the RF sputtering being especially preferred.

The power of the sputtering equipment is preferably in the range of 0.1 to 10 W/cm$^2$ for RF sputtering. The deposition rate is in the range of 0.5 to 10 nm/min., preferably 1 to 5 nm/min. The temperature of the substrate during deposition is from room temperature (25° C.) to about 150° C.

In the hole injecting and transporting layer of organic material, the following hole injecting and transporting materials are preferably used.

The hole injecting and transporting compounds used herein preferably include amine derivatives having strong fluorescence, for example, triphenyldiamine derivatives which are hole transporting compounds, styrylamine derivatives and amine derivatives having an aromatic fused ring.

As the hole injecting and transporting compound, use may be made of various organic compounds as described, for example, in JP-A 295695/1988, 191694/1990, 792/1991, 234681/1993, 239455/1993, 299174/1993, 126225/1995, 126226/1995, and 100172/1996, and EP 0650955A1. Exemplary are tetraarylbenzidine compounds (triaryldiamines or triphenyldiamines: TPD), aromatic tertiary amines, hydrazone derivatives, carbazole derivatives, triazole derivatives, imidazole derivatives, oxadiazole derivatives having an amino group, and polythiophenes. These compounds may be used alone or in admixture of two or more. On combined use of two or more of these compounds, they may be formed as separate stacked layers or mixed.

The organic hole injecting and transporting layer has the functions of facilitating injection of holes into the light emitting layer and the inorganic insulative hole injecting and transporting layer, transporting holes stably, and obstructing electrons. This layer is effective for increasing the number of holes and electrons injected into the light emitting layer and confining holes and electrons therein for optimizing the recombination region to improve luminous efficiency.

The thickness of the organic hole injecting and transporting layer is not critical and varies with a particular formation technique although its thickness is usually preferred to range from about 5 nm to about 500 nm, especially about 10 nm to about 300 nm.

The thickness of the organic hole injecting and transporting layer is equal to or ranges from about 1/10 times to about 10 times the thickness of the light emitting layer although it depends on the design of a recombination/light emitting region. When the hole injecting and transporting layer is divided into an injecting layer and a transporting layer, preferably the injecting layer is at least 1 nm thick and the transporting layer is at least 1 nm thick. The upper limit of thickness is usually about 500 nm for the injecting layer and about 500 nm for the transporting layer. The same film thickness applies when two injecting/transporting layers are provided.

Figure 2:
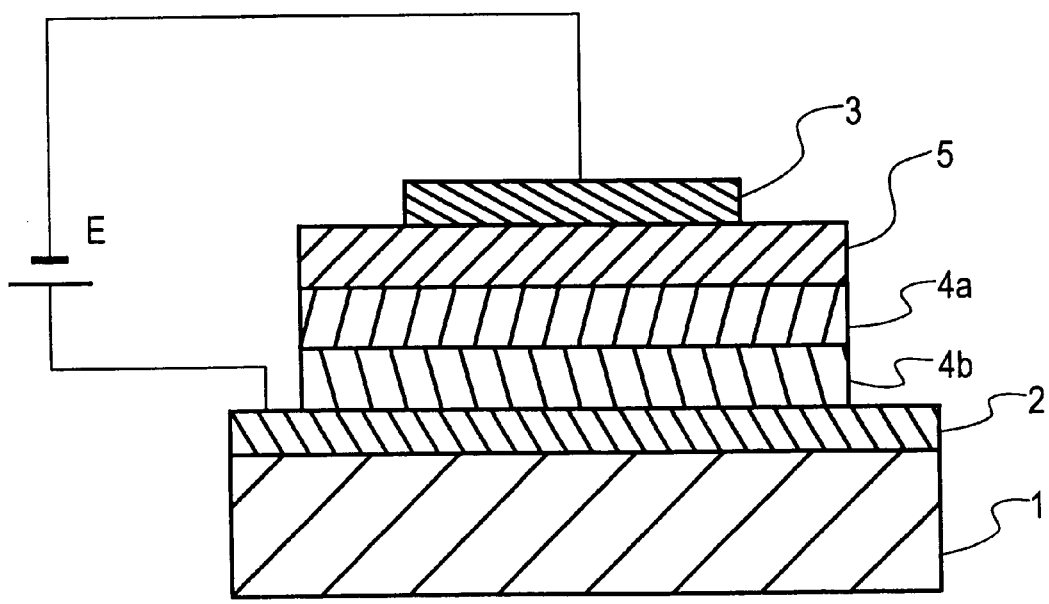
FIG. 2 is a schematic cross-sectional view illustrating the configuration of an organic EL device according to another embodiment of the invention.
Figure 3:
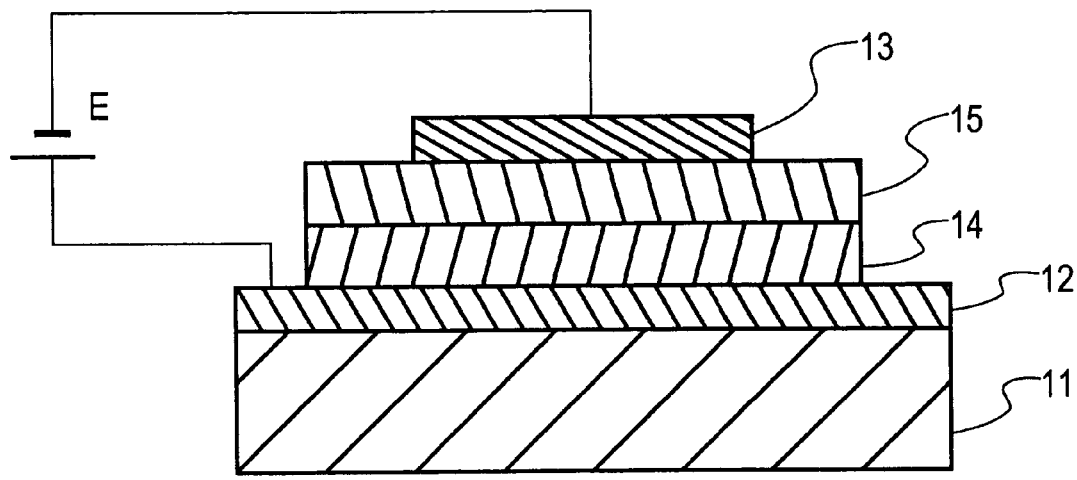
FIG. 3 is a schematic cross-sectional view illustrating an organic EL device of the two-layer structure having a hole transporting layer.
Figure 4:
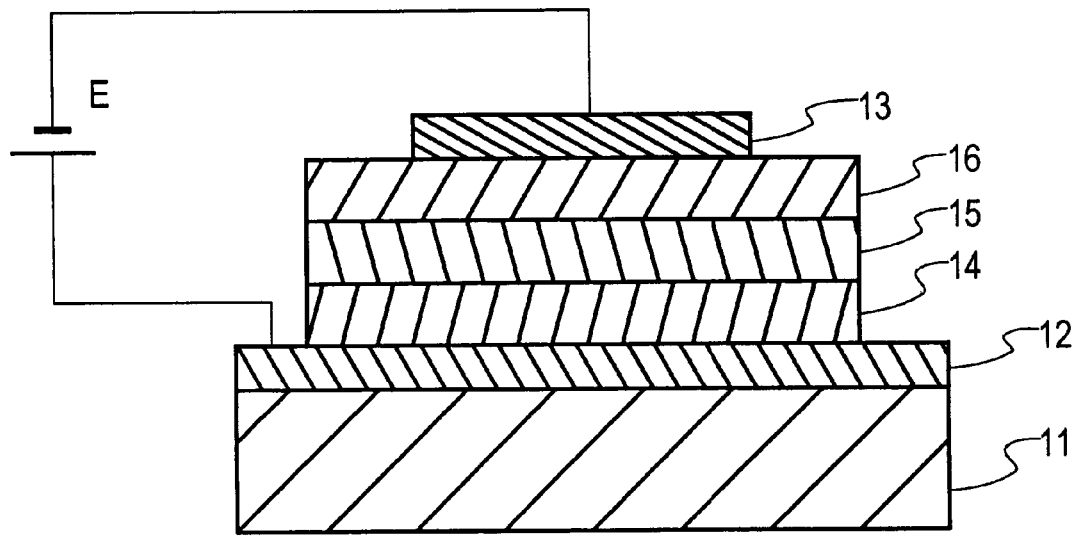
FIG. 4 is a schematic cross-sectional view illustrating an organic EL device of the three-layer structure having a hole transporting layer and an electron transporting layer.

As shown in FIG. 1, for example, the organic EL device of the invention may have the successively stacked configuration of substrate 1/hole injecting electrode 2/organic hole injecting and transporting layer 4a/inorganic insulative hole injecting and transporting layer 4b/light emitting layer 5/electron injecting electrode 3. Also as shown in FIG. 2, for example, the organic EL device of the invention may have the successively stacked configuration of substrate 1/hole injecting electrode 2/inorganic insulative hole injecting and transporting layer 4b/organic hole injecting and transporting layer 4a/light emitting layer electron injecting electrode 3. The configuration of FIG. 1 is preferable. It is noted that when the inorganic insulative hole injecting and transporting layer is deposited, the organic layer or the like can be subjected to ashing and hence, damaged. It is thus recommended that the hole injecting and transporting layer is initially thinly deposited in the absence of oxygen and then thickly in the presence of oxygen. The thickness reached in the absence of oxygen is preferably about ⅕ to about ½ of the final thickness. In FIGS. 1 and 2, a drive power supply E is connected between the hole injecting electrode 2 and the electron injecting electrode 3. It is understood that the light emitting layer 5 is a light emitting layer of broader definition including a layer having an electron injecting and transporting function, a light emitting layer of narrower definition, a layer having a hole injecting and transporting function, and so on.

The device of the invention may have a multi-stage configuration of electrode layer/inorganic layer and light emitting layer/electrode layer/inorganic layer and light emitting layer/electrode layer/inorganic layer and light emitting layer/electrode layer, or further repeated layers. Such a multi-stage configuration is effective for adjusting or multiplying the color of emitted light.

For the hole injecting electrode, materials capable of effectively injecting holes into the hole injecting layer are preferred. Useful are compositions based on tin-doped indium oxide (ITO), zinc-doped indium oxide (IZO), indium oxide ($In_2O_3$), tin oxide ($SnO_2$) or zinc oxide (ZnO). These oxides may deviate more or less from their stoichiometric compositions. For ITO, an appropriate proportion of $SnO_2$ mixed with $In_2O_3$ is about 1 to 20%, more preferably about 5 to 12% by weight. For IZO, an appropriate proportion of ZnO mixed with $In_2O_3$ is about 12 to 32% by weight. The hole injecting electrode may further contain silicon oxide ($SiO_2$). The content of silicon oxide ($SiO_2$) is preferably about 0.5 to 10% as expressed in mol percent of $SiO_2$ based on ITO.

The electrode on the light exit side should preferably have a light transmittance of at least 50%, more preferably at least 60%, further preferably at least 80%, especially at least 90% in the light emission band, typically from 400 to 700 nm, and especially at each light emission. With a lower transmittance, the light emitted by the light emitting layer is attenuated through the electrode, failing to provide a luminance necessary as a light emitting device. It is noted that the light transmittance of the electrode is sometimes set low for the purpose of increasing the contrast ratio for improving visual perception.

Preferably the electrode has a thickness of 50 to 500 nm, especially 50 to 300 nm. Although the upper limit of the electrode thickness is not critical, a too thick electrode would cause a drop of transmittance and separation. Too thin an electrode is insufficient for its effect and low in film strength during fabrication. The negative electrode (or electron injecting electrode) is preferably formed from materials having a low work function, for example, metal elements such as K, Li, Na, Mg, La, Ce, Ca, Sr, Ba, Al, Ag, In, Sn, Zn, and Zr, and binary or ternary alloys containing such metal elements for stability improvement. Exemplary alloys are Ag-Mg (Ag: 0.1 to 50 at%), Al-Li (Li: 0.01 to 14 at%), In-Mg (Mg: 50 to 80 at%), and Al-Ca (Ca: 0.01 to 20 at%). A thin film of such a material or a multilayer thin film of two or more materials may be used as the electron injecting electrode layer.

The electron injecting electrode thin film may have at least a sufficient thickness to effect electron injection, for example, a thickness of at least 0.1 nm, preferably at least 0.5 nm, more preferably at least 1 nm. Although the upper limit is not critical, the electrode thickness is typically about 1 to about 500 nm. On the electron injecting electrode, an auxiliary or protective electrode may be provided, if desired.

The auxiliary electrode may have at least a sufficient thickness to ensure efficient electron injection and prevent the ingress of moisture, oxygen and organic solvents, for example, a thickness of at least 50 nm, preferably at least 100 nm, more preferably 100 to 500 nm. A too thin auxiliary electrode layer would exert its effect little, lose a step coverage capability, and provide insufficient connection to a terminal electrode. If too thick, greater stresses are generated in the auxiliary electrode layer, accelerating the growth rate of dark spots.

For the auxiliary electrode, an appropriate material may be chosen in consideration of the material of the electron injecting electrode to be combined therewith. For example, low resistivity metals such as aluminum may be used when electron injection efficiency is of importance. Metal compounds such as TiN may be used when sealing is of importance.

The thickness of the electron injecting electrode and the auxiliary electrode combined is usually about 50 to about 500 nm though it is not critical.

The light emitting layer is a thin film of an organic compound participating in light emission or a multilayer film of two or more organic compounds participating in light emission.

The light emitting layer has the functions of injecting holes and electrons, transporting them, and recombining holes and electrons to create excitons. It is preferred that relatively electronically neutral compounds be used in the light emitting layer so that electron and holes may be readily injected and transported in a well-balanced manner.

The organic electron injecting and transporting layer has the functions of facilitating injection of electrons from the electron injecting electrode, transporting electrons stably, and obstructing holes. This layer is effective for increasing the number of holes and electrons injected into the light emitting layer and confining holes and electrons therein for optimizing the recombination region to improve luminous efficiency.

The thicknesses of the light emitting layer and the electron injecting and transporting layer are not critical and vary with a particular formation technique although their thickness is usually preferred to range from about 5 nm to about 500 nm, especially about 10 nm to about 300 nm.

The thickness of the electron injecting and transporting layer is equal to or ranges from about 1/10 times to about 10 times the thickness of the light emitting layer although it depends on the design of a recombination/light emitting region. When the electron injecting and transporting layer is divided into an injecting layer and a transporting layer, preferably the injecting layer is at least 1 nm thick and the transporting layer is at least 1 nm thick. The upper limit of thickness is usually about 500 nm for the injecting layer and about 500 nm for the transporting layer. The same film thickness applies when two injecting/transporting layers are provided.

The light emitting layer of the organic EL device contains a fluorescent material that is a compound having a light emitting function. The fluorescent material may be at least one member selected from compounds as disclosed, for example, in JP-A 264692/1988, such as quinacridone, rubrene, and styryl dyes. Also, quinoline derivatives such as metal complex dyes having 8-quinolinol or a derivative thereof as the ligand such as tris(8-quinolinolato)aluminum are included as well as tetraphenylbutadiene, anthracene, perylene, coronene, and 12-phthaloperinone derivatives. Further useful are the phenylanthracene derivatives described in JP-A 12600/1996 (Japanese Patent Application No. 110569/1994) and the tetraarylethene derivatives described in JP-A 12969/1996 (Japanese Patent Application No. 114456/1994).

It is preferred to use such a compound in combination with a host material capable of light emission by itself, that is, to use the compound as a dopant. In this embodiment, the content of the compound in the light emitting layer is preferably 0.01 to 10% by weight, especially 0.1 to 5% by weight. By using the compound in combination with the host material, the light emission wavelength of the host material can be altered, allowing light emission to be shifted to a longer wavelength and improving the luminous efficiency and stability of the device.

As the host material, quinolinolato complexes are preferable, with aluminum complexes having 8-quinolinol or a derivative thereof as the ligand being more preferable.

These aluminum complexes are disclosed in JP-A 264692/1988, 255190/1991, 70733/1993, 258859/1993 and 215874/1994.

Illustrative examples include tris(8-quinolinolato)-aluminum, bis(8-quinolinolato)magnesium, bis(benzo{f}-8-quinolinolato) zinc, bis (2-methyl-8-quinolinolato) aluminum oxide, tris(8-quinolinolato)indium, tris(5-methyl-8-quinolinolato)aluminum, 8-quinolinolatolithium, tris(5-chloro-8-quinolinolato)gallium, bis(5-chloro-8-quinolinolato)calcium, 5,7-dichloro-8-quinolinolatoaluminum, tris(5,7-dibromo-8-hydroxyquinolinolato)aluminum, and poly[zinc(II)-bis(8-hydroxy-5-quinolinyl)methane].

Also useful are aluminum complexes having another ligand in addition to 8-quinolinol or a derivative thereof. Examples include bis(2-methyl-8-quinolinolato)-(phenolato)aluminum(III), bis(2-methyl-8-quinolinolato)-(orthocresolato)aluminum(III), bis(2-methyl-8-quinolinolato)-(metacresolato)aluminum(III), bis(2-methyl-8-quinolinolato)-(paracresolato)aluminum(III), bis(2-methyl-8-quinolinolato)-(ortho-phenylphenolato)aluminum (III), bis(2-methyl-8-quinolinolato)(meta-phenylphenolato) aluminum(III), bis(2-methyl-8-quinolinolato)(para-phenylphenolato)aluminum(III), bis(2-methyl-8-quinolinolato)(2,3-dimethylphenolato)aluminum(III), bis(2-methyl-8-quinolinolato)(2,6-dimethyl-phenolato)aluminum (III), bis(2-methyl-8-quinolinolato)(3,4-dimethylphenolato) aluminum(III), bis(2-methyl-8-quinolinolato)(3,5-dimethylphenolato)aluminum(III), bis(2-methyl-8-quinolinolato)(3,5-di-tert-butylphenolato)-aluminum(III), bis(2-methyl-8-quinolinolato)(2,6-diphenyl-phenolato) aluminum(III), bis(2-methyl-8-quinolinolato)-(2,4,6-triphenylphenolato)aluminum(III), bis(2-methyl-8-quinolinolato) (2,3,6-trimethylphenolato)aluminum(III), bis (2-methyl-8-quinolinolato)(2,3,5,6-tetramethylphenolato)-aluminum(III), bis(2-methyl-8-quinolinolato)(1-naphtholato)-alumninum(III), bis(2-methyl-8-quinolinolato) (2-naphtholato)-aluminum(III), bis(2,4-dimethyl-8-quinolinolato)(ortho-phenylphenolato)aluminum(III), bis(2, 4-dimethyl-8-quinolinolato)(para-phenylphenolato) aluminum(III), bis(2,4-dimethyl-8-quinolinolato)(meta-phenylphenolato)-aluminum(III), bis(2,4-dimethyl-8-quinolinolato)(3,5-dimethylphenolato)aluminum(III), bis(2, 4-dimethyl-8-quinolinolato)(3,5-di-tert-butylphenolato) aluminum(III), bis(2-methyl-4-ethyl-8-quinolinolato)(para-cresolato)-aluminum(III), bis(2-methyl-4-methoxy-8-quinolinolato)(para-phenylphenolato)aluminum(III), bis(2-methyl-5-cyano-8-quinolinolato)(ortho-cresolato)aluminum (III), and bis(2-methyl-6-trifluoromethyl-8-quinolinolato) (2-naphtholato)-aluminum(III).

Also acceptable are bis(2-methyl-8-quinolinolato) aluminum(III)-$\mu$-oxo-bis(2-methyl-8-quinolinolato) aluminum (III), bis(2,4-dimethyl-8-quinolinolato)aluminum (III)-$\mu$-oxo-bis(2,4-dimethyl-8-quinolinolato)aluminum (III), bis(4-ethy-2-methyl-8-quinolinolato)aluminum(III)-$\mu$-oxo-bis(4-ethyl-2-methyl-8-quinolinolato)aluminum(III), bis(2-methyl-4-methoxyquinolinolato)aluminum(III)-$\mu$-oxo-bis(2-methyl-4-methoxyquinolinolato)aluminum(III), bis(5-cyano-2-methyl-8-quinolinolato)aluminum(III)-$\mu$-oxo-bis(5-cyano-2-methyl-8-quinolinolato)aluminum(III), and bis(2-methyl-5-trifluoromethyl-8-quinolinolato) aluminum(III)-$\mu$-oxo-bis(2-methyl-5-trifluoromethyl-8-quinolinolato)aluminum(III).

Other useful host materials are the phenylanthracene derivatives described in JP-A 12600/1996 (Japanese Patent Application No. 110569/1994) and the tetraarylethene derivatives described in JP-A 12969/1996 (Japanese Patent Application No. 114456/1994).

The light emitting layer may also serve as the electron injecting and transporting layer. In this case, tris(8-quinolinolato)aluminum etc. are preferably used. These fluorescent materials may be evaporated.

Also, if necessary, the light emitting layer may also be a layer of a mixture of at least one hole injecting and transporting compound and at least one electron injecting and transporting compound, in which a dopant is preferably contained. In such a mix layer, the content of the compound is preferably 0.01 to 20% by weight, especially 0.1 to 15% by weight.

In the mix layer, carrier hopping conduction paths are created, allowing carriers to move through a polarly predominant material while injection of carriers of opposite polarity is rather inhibited, and the organic compound becomes less susceptible to damage, resulting in the advantage of an extended device life. By incorporating the aforementioned dopant in such a mix layer, the light emission wavelength the mix layer itself possesses can be altered, allowing light emission to be shifted to a longer wavelength and improving the luminous intensity and stability of the device.

The hole injecting and transporting compound and electron injecting and transporting compound used in the mix layer may be selected from the hole injecting and transporting compounds and the electron injecting and transporting compounds to be described later, respectively. Inter alia, the hole injecting and transporting compound is preferably selected from amine derivatives having strong fluorescence, for example, triphenyldiamine derivatives which are hole transporting materials, styrylamine derivatives and amine derivatives having an aromatic fused ring.

The electron injecting and transporting compound is preferably selected from quinoline derivatives and metal complexes having 8-quinolinol or a derivative thereof as a ligand, especially tris(8-quinolinolato)aluminum (Alq3). The aforementioned phenylanthracene derivatives and tetraarylethene derivatives are also preferable.

As the hole injecting and transporting compound, amine derivatives having intense fluorescence are useful, for example, the triphenyldiamine derivatives, styrylamine derivatives, and amine derivatives having an aromatic fused ring, exemplified above as the hole injecting and transporting material.

The mix ratio is preferably determined in accordance with the carrier density and carrier mobility of the respective compounds. It is usually preferred that the weight ratio of the hole injecting and transporting compound to the electron injecting and transporting compound range from about 1/99 to about 99/1, more preferably from about 10/90 to about 90/10, especially from about 20/80 to about 80/20.

Also preferably, the thickness of the mix layer ranges from the thickness of a mono-molecular layer to less than the thickness of the organic compound layer. Specifically, the mix layer is preferably 1 to 85 nm, more preferably 5 to 60 nm, especially 5 to 50 nm thick.

Preferably the mix layer is formed by a co-deposition process of evaporating the compounds from distinct sources.

If both the compounds have approximately equal or very close vapor pressures or evaporation temperatures, they may be pre-mixed in a common evaporation boat, from which they are evaporated together. The mix layer is preferably a uniform mixture of both the compounds although the compounds can be present in island form. The light emitting layer is generally formed to a predetermined thickness by evaporating an organic fluorescent material or coating a dispersion thereof in a resin binder.

In the electron injecting and transporting layer, there may be used quinoline derivatives including organic metal complexes having 8-quinolinol or a derivative thereof as a ligand such as tris(8-quinolinolato)aluminum (Alq3), oxadiazole derivatives, perylene derivatives, pyridine derivatives, pyrimidine derivatives, quinoxaline derivatives, diphenylquinone derivatives, and nitro-substituted fluorene derivatives. The electron injecting and transporting layer can also serve as the light emitting layer. In this case, use of tris(8-quinolinolato)aluminum etc. is preferred. Like the light emitting layer, the electron injecting and transporting layer may be formed by evaporation or the like.

Where the electron injecting and transporting layer is formed separately as an electron injecting layer and an electron transporting layer, two or more compounds are selected in a proper combination from the compounds commonly used in electron injecting and transporting layers. In this regard, it is preferred to stack layers in such an order that a layer of a compound having a greater electron affinity may be disposed adjacent the electron injecting electrode. The order of stacking also applies where a plurality of electron injecting and transporting layers are provided.

In forming the organic hole injecting and transporting layer, the light emitting layer, and the organic electron injecting and transporting layer, vacuum evaporation is preferably used because homogeneous thin films are available. By utilizing vacuum evaporation, there is obtained a homogeneous thin film which is amorphous or has a crystal grain size of less than 0.2 $\mu$m. If the grain size is more than 0.2 $\mu$m, uneven light emission would take place and the drive voltage of the device must be increased with a substantial drop of hole injection efficiency.

The conditions for vacuum evaporation are not critical although a vacuum of $10^{-4}$ Pa or lower and a deposition rate of about 0.01 to 1 nm/sec. are preferred. It is preferred to successively form layers in vacuum because the successive formation in vacuum can avoid adsorption of impurities on the interface between the layers, thus ensuring better erformance. Also, the drive voltage of a device can be educed and the development and growth of dark spots be estrained.

In the embodiment wherein the respective layers are formed by vacuum evaporation, where it is desired for a single layer to contain two or more compounds, boats having the compounds received therein are individually temperature controlled to achieve co-deposition.

Further preferably, a shield plate may be provided on the device in order to prevent the organic layers and electrodes from oxidation. In order to prevent the ingress of moisture, the shield plate is attached to the substrate through an adhesive resin layer for sealing. The sealing gas is preferably an inert gas such as argon, helium, and nitrogen. The inert gas should preferably have a moisture content of less than 100 ppm, more preferably less than 10 ppm, especially less than 1 ppm. The lower limit of the moisture content is usually about 0.1 ppm though not critical.

The shield plate is selected from plates of transparent or translucent materials such as glass, quartz and resins, with glass being especially preferred. Alkali glass is preferred because of economy although other glass compositions such as soda lime glass, lead alkali glass, borosilicate glass, aluminosilicate glass, and silica glass are also useful. Of these, plates of soda glass without surface treatment are inexpensive and useful. Beside the glass plates, metal plates and plastic plates may also be used as the shield plate.

Using a spacer for height adjustment, the shield plate may be held at a desired height over the layer structure. The spacer may be formed from resin beads, silica beads, glass beads, and glass fibers, with the glass beads being especially preferred. Usually the spacer is formed from particles having a narrow particle size distribution while the shape of particles is not critical. Particles of any shape which does not obstruct the spacer function may be used. Preferred particles have an equivalent circle diameter of about 1 to 20 $\mu$m, more preferably about 1 to 10 $\mu$m, most preferably about 2 to 8 $\mu$m. Particles of such diameter should preferably have a length of less than about 100 $\mu$m. The lower limit of length is not critical although it is usually equal to or more than the diameter.

When a shield plate having a recess is used, the spacer may be used or not. When used, the spacer should preferably have a diameter in the above-described range, especially 2 to 8 $\mu$m.

The spacer may be premixed in a sealing adhesive or mixed with a sealing adhesion at the time of bonding. The content of the spacer in the sealing adhesive is preferably 0.01 to 30% by weight, more preferably 0.1 to 5% by weight.

Any of adhesives which can maintain stable bond strength and gas tightness may be used although UV curable epoxy resin adhesives of cation curing type are preferred.

In the organic EL structure of the invention, the substrate may be selected from amorphous substrates of glass and quartz and crystalline substrates of Si, GaAs, ZnSe, ZnS, GaP, and InP, for example. If desired, buffer layers of crystalline materials, amorphous materials or metals may be formed on such crystalline substrates. Metal substrates including Mo, Al, Pt, Ir, Au and Pd are also useful. Of these, glass substrates are preferred. Since the substrate is often situated on the light exit side, the substrate should preferably have a light transmittance as described above for the electrode.

A plurality of inventive devices may be arrayed on a plane. A color display is obtained when the respective devices of a planar array differ in emission color.

The substrate may be provided with a color filter film, a fluorescent material-containing color conversion film or a dielectric reflecting film for controlling the color of light emission.

The color filter film used herein may be a color filter as used in liquid crystal displays and the like. The properties of a color filter may be adjusted in accordance with the light emission of the organic EL device so as to optimize the extraction efficiency and color purity.

It is also preferred to use a color filter capable of cutting external light of short wavelength which is otherwise absorbed by the EL device materials and fluorescence conversion layer, because the light resistance and display contrast of the device are improved.

An optical thin film such as a multilayer dielectric film may be used instead of the color filter.

The fluorescence conversion filter film is to convert the color of light emission by absorbing electroluminescence and allowing the fluorescent material in the film to emit light. It is formed from three components: a binder, a fluorescent material, and a light absorbing material.

The fluorescent material used may basically have a high fluorescent quantum yield and desirably exhibits strong absorption in the electroluminescent wavelength region. In practice, laser dyes are appropriate. Use may be made of rhodamine compounds, perylene compounds, cyanine compounds, phthalocyanine compounds (including subphthalocyanines), naphthalimide compounds, fused ring hydrocarbon compounds, fused heterocyclic compounds, styryl compounds, and coumarin compounds.

The binder is selected from materials which do not cause extinction of fluorescence, preferably those materials which can be finely patterned by photolithography or printing technique. Also, where the filter film is formed on the substrate so as to be contiguous to the hole injecting electrode, those materials which are not damaged during deposition of the hole injecting electrode (such as ITO or IZO) are preferable.

The light absorbing material is used when the light absorption of the fluorescent material is short and may be omitted if unnecessary. The light absorbing material may also be selected from materials which do not cause extinction of fluorescence of the fluorescent material.

The organic EL device of the invention is generally of the dc or pulse drive type. The applied voltage is generally about 2 to 30 volts.

In addition to the display application, the organic EL device of the invention may find use as various optical devices such as optical pickups for use in reading and writing in storages, repeaters in transmission lines for optical communication, and photo couplers.

EXAMPLE

Examples of the invention are given below by way of illustration.

Example 1

A substrate of (7059) glass by Corning Glass Works was scrubbed using a neutral detergent.

By RF magnetron sputtering from a target of ITO oxide, a hole injecting electrode layer of ITO having a thickness of 200 nm was formed on the substrate at a temperature of 250° C.

After its ITO electrode-bearing surface was cleaned with $UV/O_3$, the substrate was secured by a holder in a vacuum deposition chamber, which was evacuated to a vacuum of $1\times10^{-4}$ Pa or lower.

Next, by an evaporation process, 4,4',4"-tris(N-(3-methylphenyl)-N-phenylamino)triphenylamine (m-MTDATA) was evaporated at a deposition rate of 0.1 nm/sec to a thickness of 30 nm, forming a hole injecting layer.

Next, using a target of $SiO_{1.8}$, an inorganic insulative hole injecting and transporting layer was deposited to a thickness of 1 nm. The sputtering gas used was a mixture of argon and 1% of oxygen ($O_2$). Sputtering conditions included a substrate temperature of 25° C., a deposition rate of 1 nm/min, an operating pressure of 0.5 Pa, and an input power of 5 $W/cm^2$. The inorganic insulative hole injecting and transporting layer as deposited had a composition of $SiO_{1.6}$.

With the vacuum kept, N,N,N',N'-tetrakis(m-biphenyl)1,1'-biphenyl-4,4'-diamine (TPD), tris(8-quinolinolato) aluminum (Alq3), and rubrene were evaporated at an overall deposition rate of 0.2 nm/sec to a thickness of 100 nm, forming a light emitting layer. The layer consisted of a mixture of TPD and Alq3 in a weight ratio of 1:1 doped with 10 vol% of rubrene.

With the vacuum further kept, tris(8-quinolinolato)-aluminum (Alq3) was evaporated at an overall deposition rate of 0.2 nm/sec. to a thickness of 30 nm, forming an electron injecting and transporting layer.

Next, with the vacuum kept, AlLi (Li 7 at%) was evaporated to a thickness of 1 nm, and Al was successively evaporated to a thickness of 200 nm to form an electron injecting electrode and an auxiliary electrode, respectively. Final sealing of a glass shield completed an organic EL device. As a comparative sample, a sample was fabricated without forming the inorganic insulative hole injecting and transporting layer.

An accelerated test was then carried out by driving the device at room temperature (25° C.) and a constant current density of 100mA/$cm^2$ for determining the luminance of light emission and life. This organic EL device had an initial luminance of 7,000 cd/$m^2$ and maintained more than 50% of the initial luminance even after 300 hours of operation. In the organic EL device, neither leakage nor dark spots were found. In contrast, the comparative sample had an initial luminance of 6,000 cd/$m^2$, but its luminance dropped below 50% of the initial luminance after 100 hours of operation.

Example 2

An organic EL device was prepared as in Example 1 except that in the step of depositing the inorganic insulative hole injecting and transporting layer, the target used was changed to the composition $SiO_2$, and the flow rate of $O_2$ in the sputtering gas was changed so as to give a mixing proportion of 5% based on argon, so that the resulting layer had the composition $SiO_{1.9}$ Similarly, an organic EL device was prepared as in Example 1 except that the target used was changed to the composition $SiO_2$, and the flow rate of $O_2$ in the sputtering gas was changed so as to give a mixing proportion of 30% based on argon, so that the resulting layer had the composition $SiO_{1.95}$. Similarly, an organic EL device was prepared as in Example 1 except that the target used was changed to the composition $GeO_2$, and the flow rate of $O_2$ in the sputtering gas was changed so as to give a mixing proportion of 30% based on argon, so that the resulting layer had the composition $GeO_{1.96}$. Similarly, an organic EL device was prepared as in Example 1 except that the target used was changed to the composition $Si_{0.5}Ge_{0.5}O_2$, and the flow rate of $O_2$ in the sputtering gas was changed so as to give a mixing proportion of 10% based on argon, so that the resulting layer had the composition $Si_{0.5}Ge_{0.5}O_{1.92}$. These samples were tested as in Example 1, finding substantially equivalent results to Example 1.

BENEFITS OF THE INVENTION

According to the invention, organic EL devices having better performance than prior art devices having hole injecting and transporting layers using organic materials, a long life, weather resistance, high stability, high efficiency, and low cost are realized.

What is claimed is:

1. An organic electroluminescent device comprising a hole injecting electrode, a negative electrode, and at least two organic layers between the electrodes, said organic layers including a light emitting layer having a light emitting function, said device further comprising a hole injecting and transporting layer containing a hole transporting organic material and an inorganic insulative hole injecting and transporting layer formed of an inorganic material between said hole injecting electrode and said light emitting layer, said inorganic insulative hole injecting and transporting layer comprising silicon oxide or germanium oxide or a mixture of silicon oxide and germanium oxide as a main component, the main component having an average composition represented by the formula: $(Si_{1-x}Ge_x)O_y$ wherein $0 \leq x \leq 1$ and $1 < y \leq 2$.

2. The organic electroluminescent device of claim 1 wherein said inorganic insulative hole injecting and transporting layer satisfies $1.4 \leq y \leq 1.99$.

3. The organic electroluminescent device of claim 1 wherein said inorganic insulative hole injecting and transporting layer has a thickness of up to 5 nm.

4. The organic electroluminescent device of claim 1 wherein said inorganic insulative hole injecting and transporting layer is formed between said light emitting layer and said hole injecting and transporting layer containing a hole transporting organic material.

* * * * *

UNITED STATES PATENT AND TRADEMARK OFFICE
CERTIFICATE OF CORRECTION

PATENT NO. : 6,208,076 B1
DATED : March 27, 2001
INVENTOR(S) : Michio Arai et al.

It is certified that error appears in the above-identified patent and that said Letters Patent is hereby corrected as shown below:

Title page,
Item [54], Title, "ORGANIC ELECTROLUMINESCENT DEVICE WITH SILICONE OXIDE AND/OR GERMANIUM OXIDE INSULATIVE LAYER" should read -- ORGANIC ELECTROLUMINESCENT DEVICE --.

Signed and Sealed this

Twenty-eighth Day of June, 2005

JON W. DUDAS
*Director of the United States Patent and Trademark Office*